United States Patent [19]
Downing et al.

[11] Patent Number: 6,141,219
[45] Date of Patent: Oct. 31, 2000

[54] MODULAR POWER ELECTRONICS DIE HAVING INTEGRATED COOLING APPARATUS

[75] Inventors: Robert Scott Downing; Scott Palmer Wilkinson; Thomas Albert Sutrina, all of Rockford, Ill.

[73] Assignee: Sundstrand Corporation, Rockford, Ill.

[21] Appl. No.: 09/220,114

[22] Filed: Dec. 23, 1998

[51] Int. Cl.[7] ........................................ H05K 7/20
[52] U.S. Cl. ................... 361/704; 361/689; 361/699; 361/707; 361/717; 361/784; 361/785; 165/80.3; 165/146; 165/185; 165/104.33; 174/16.3; 257/714
[58] Field of Search .................. 361/683, 685, 361/687–692, 695–699, 704–710, 717–722, 784–785; 257/706–727, 689–692, 698, 699; 428/64, 65, 195, 522; 174/16.3; 165/80.3, 80.4, 46, 146, 104.33, 185, 80.2; 29/890.03, 521, 557, 505

[56] References Cited

U.S. PATENT DOCUMENTS

| | | |
|---|---|---|
| 2,780,757 | 2/1957 | Thornhill et al. .................. 317/234 |
| 2,942,165 | 6/1960 | Jackson et al. .................... 317/234 |
| 4,158,745 | 6/1979 | Keller ................................ 174/52 |
| 4,489,778 | 12/1984 | Skoog . |
| 4,494,171 | 1/1985 | Bland et al. . |
| 4,559,580 | 12/1985 | Lutfy . |
| 4,680,673 | 7/1987 | Taverdet . |
| 4,696,342 | 9/1987 | Yamauchi et al. . |
| 4,729,060 | 3/1988 | Yamamoto et al. . |
| 4,750,086 | 6/1988 | Mittal . |
| 4,765,397 | 8/1988 | Chrysler et al. ............ 165/104.33 |
| 4,879,891 | 11/1989 | Hinshaw . |
| 4,941,530 | 7/1990 | Crowe . |
| 5,046,552 | 9/1991 | Tousignant ........................ 165/46 |
| 5,070,936 | 12/1991 | Carrol et al. ..................... 361/387 |
| 5,088,005 | 2/1992 | Ciaccio ............................. 361/385 |
| 5,243,223 | 9/1993 | Yamada et al. ................... 257/789 |
| 5,349,498 | 9/1994 | Tanzer et al. ..................... 361/689 |
| 5,380,956 | 1/1995 | Loo et al. . |
| 5,386,338 | 1/1995 | Jordan et al. . |
| 5,437,328 | 8/1995 | Simons ............................. 165/146 |
| 5,455,458 | 10/1995 | Quon et al. ....................... 257/712 |
| 5,518,071 | 5/1996 | Lee . |
| 5,583,317 | 12/1996 | Mennucci et al. ............... 174/16.3 |
| 5,653,285 | 8/1997 | Lee .................................... 165/185 |
| 5,966,291 | 10/1999 | Baumel et al. ................... 361/707 |
| 6,000,132 | 12/1999 | Butler .............................. 29/890.03 |
| B1 4,884,331 | 5/1994 | Hinshaw . |

FOREIGN PATENT DOCUMENTS

| | | | |
|---|---|---|---|
| 0 353 437 | 6/1989 | European Pat. Off. ............... 23/473 |
| 000834923A1 | 4/1998 | France ........................ H01L 25/07 |
| 58-153885 | 8/1983 | Japan ..................................... 23/46 |
| 59-143388A | 8/1984 | Japan ............................ H05K 7/20 |
| 401054800A | 3/1989 | Japan ............................ H05K 7/20 |
| 407176654A | 7/1995 | Japan ............................ H01L 23/36 |
| 2 204 181 | 11/1988 | United Kingdom . |
| 2 278 307 | 11/1994 | United Kingdom . |
| 99/03648 | 2/1998 | WIPO . |

Primary Examiner—Leo P. Picard
Assistant Examiner—Michael Datskovsky
Attorney, Agent, or Firm—Marshall, O'Toole, Gerstein, Murray & Borun

[57] ABSTRACT

A power electronics device incorporating a modular packaging concept and having an integrated device cooler is disclosed. A modular power electronics die cooler is designed for use with a coolant manifold adapted to circulate a coolant medium past a mounting receptacle. The modular power electronics die cooler comprises a base unit adapted for mounting to the manifold, with the base unit having an upper portion and a lower portion. The upper portion includes a plurality of sidewalls defining an enclosure, and the lower portion includes a heat sink and is adapted for insertion in the manifold receptacle. At least one electronic component is mounted within the enclosure. Accordingly, upon mounting the base unit to the manifold, the heat sink is positioned in the coolant medium and thereby dissipates heat produced by the electronic component.

8 Claims, 7 Drawing Sheets

MODULAR POWER ELECTRONICS DIE HAVING INTEGRATED COOLING APPARATUS

FIELD OF THE INVENTION

The present invention relates to a modular power electronic device having an integrated cooler.

BACKGROUND OF THE INVENTION

Power electronics devices are used in a wide variety of applications, including motor drives, converters, inverters, active front end filters and Variable Speed Constant Frequency (VSCF) power conversion. Although the amount of heat produced by each device will typically vary from application to application, increasing packaging densities has made thermal management an increasingly critical design consideration.

Typically, each power electronics device has an associated heat sink or cooler in order to maintain the temperature of the device within an acceptable range. The amount of heat dissipated by the cooler depends on both the size as well as the design of the cooler. Some examples of heat sink or cooler designs include pin-fin, plate fin, or other designs. Examples of cooler designs can be found in U.K. Pat. No. GB 2,278,307B, U.S. Pat. No. 5,380,956, and U.S. Pat. No. 4,559,580. Once the amount of heat produced by the electronics device is known, a designer must construct a cooler having the ability to reject the heat produced by the component to the coolant medium (e.g., air or liquid) within an acceptable temperature difference. If the rise in cooler temperature is too large for the environment temperature, then the electronics component will overheat. Thus, the designer must decide on an appropriate cooler design, and must then determine the size of the cooler based on the heat dissipation properties of the chosen cooler design.

Despite all these design variables, it would nevertheless be desirable to construct many different power electronics devices for many different applications using a standardized packaging concept in order to decrease production costs. Ideally, such a modular packaging concept would permit the use of any one of a variety of cooler designs, all having the same or similar dimensions, in order to achieve the proper amount of heat dissipation dictated by the thermal production of the associated power electronics device. Using a modular packaging concept with standardized dimensions, the designer may obtain greater cooling capacity simply by adding additional (or higher performance) cooler units. In order to achieve even greater production efficiency, such a modular packaging concept could be adapted for use with a standardized coolant manifold constructed to accept any power electronics device constructed in accordance with the standardized dimensions, regardless of the type of heat sink integrated into the power electronics device.

SUMMARY OF THE INVENTION

A modular power electronics device having an integrated cooler constructed in accordance with the teachings of the present invention permits the thermal managment properties to be custom tailored from application to application. The present device takes advantage of a modular, standarized packaging concept, and thus each power electronics device incorporating the modular packaging concept will be custom tailored to meet the thermal management properties dictated by that particular application. Moreover, the modular packaging concept permits each power electronics device to be manufactured in a standardized economical package.

According to one aspect of the invention, a modular power electronics die cooler is designed for use with a coolant manifold adapted to circulate a coolant medium past a mounting receptacle. The modular power electronics die cooler comprises a base unit mountable to the manifold, with the base unit having an upper portion and a lower portion. The upper portion includes a plurality of sidewalls defining an enclosure, and the lower portion includes a heat sink and is insertable in the manifold receptacle. An electronic component is mounted within the enclosure. Accordingly, upon mounting the base unit to the manifold, the heat sink is positioned in the coolant medium and thereby dissipates heat produced by the electronic component.

In accordance with a preferred embodiment, a gel encapsulant fills a portion of the enclosure, such that the gel encapsulant surrounds the electronic component. A portion of the base unit includes a substrate, and the electronic component is mounted to the substrate. The base unit also includes a central portion sized to be received in the manifold receptacle.

The central portion includes a peripheral groove, and O-ring seal disposed in the peripheral groove so that the O-ring prevents leakage of the coolant medium from the manifold. The manifold receptacle is preferably square, and the base unit includes a square central portion having lateral dimensions corresponding to the shape of the manifold receptacle. The square construction permits the base unit to be disposed in the manifold receptacle in either of two generally perpendicular orientations.

The heat sink is adapted to define first and second alternate coolant medium flow paths through the heat sink. The first alternate flow path causes the coolant medium to undergo high heat transfer and high pressure drop, while the second alternate flow path causes the coolant medium to undergo low heat transfer and low pressure drop. The heat sink includes a plurality of parallel and offset rectangular fins, with each of the fins having a first face being disposed in the first flow path. Each of the fins further includes a second face smaller than the first face, with the second face being disposed in the second flow path. The fins may be arranged in a plurality of rows, such as a plurality of offset or staggered rows. The first and second flow paths are preferably perpendicular to each other.

The base unit may include a plurality of mounting flanges, with the mounting flanges being adapted to permit the base unit to be mounted to the manifold in either a first orientation or a second orientation. The first and second orientations are generally perpendicular to each other.

The cooler or heat sink includes a plurality of laminations. The laminations preferably include a plurality of cooperating passages defining a flow path for the coolant medium. The laminations may be adapted to define first and second alternate coolant flow paths through the heat sink, with the first alternate flow path causing the coolant medium to undergo high heat transfer and high pressure drop, while the second alternate flow path causes the coolant medium to undergo low heat transfer and low pressure drop.

In accordance with another aspect of the invention, a modular power electronics die cooler for use with a coolant manifold having a circulating coolant medium and an open mounting receptacle comprises a base unit mountable to the manifold adjacent the mounting receptacle. The base unit includes a plurality of sidewalls defining an enclosure. A portion of the enclosure defines a substrate, and a portion of the base unit defines an integral heat sink insertable in the manifold receptacle. An electronic component is mounted to the substrate. Accordingly, the base unit is mountable to the coolant manifold so that the heat sink is positioned in the coolant medium to thereby dissipate heat produced by the electronic component.

According to yet another aspect of the invention, a power electronics die cooler having an integrated cooler is adapted for use with a manifold having a coolant medium circulating through a passage. The power electronics die cooler comprises a base unit adapted for mounting to the manifold. A portion of the base unit defines a substrate, and the base unit includes an integral heat sink portion insertable in the manifold passage. An electronic component is mounted to the substrate. With the base unit mounted to the manifold the heat sink is positioned in the coolant medium, thereby dissipating heat produced by the electronic component.

According to a still further aspect of the invention, a method of forming a power electronics device having an integrated cooler comprises the steps of forming a base unit having a lower portion and an upper portion defining an enclosure, bonding an electronic component to a mounting surface within the recess, filing the recess with an encapsulating gel, and securing a cooler device to a lower portion of the base unit.

These and other objects, advantages and features of the invention will become readily apparent to those skilled in the art upon a reading of the following description.

BRIEF DESCRIPTION OF THE DRAWINGS

In the course of the following detailed description, reference will be made to the attached drawings wherein like reference numerals identify like parts and wherein.

DETAILED DESCRIPTION OF THE INVENTION

The embodiments described herein are not intended to limit the scope of the invention to the precise forms disclosed. The embodiments have been chosen and described in order to explain the principles of the invention and its practical use in order to enable others skilled in the art to follow its teachings.

Figure 11:
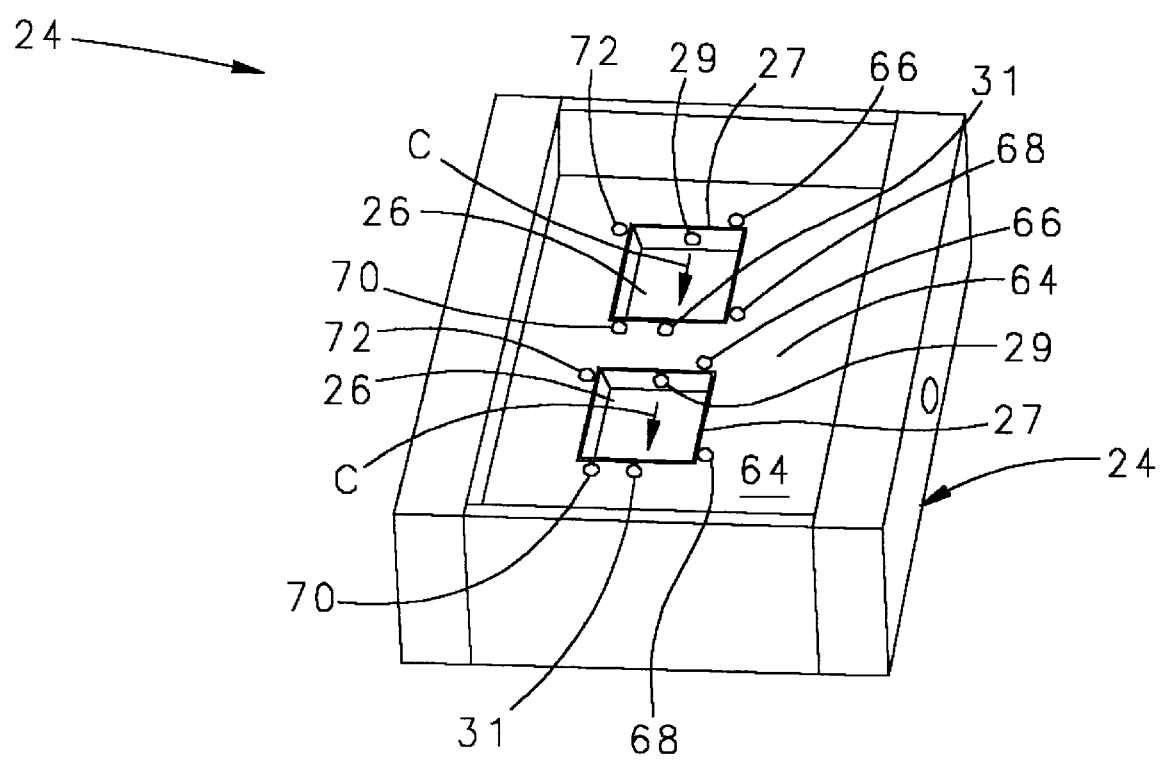
FIG. 11 is a prespective view of a one example of a coolant manifold adapted to receive two of the modular power electronics devices of FIG. 1 such that a coolant medium may be communicated past the integrated cooler of each power electronics device.
Figure 12:
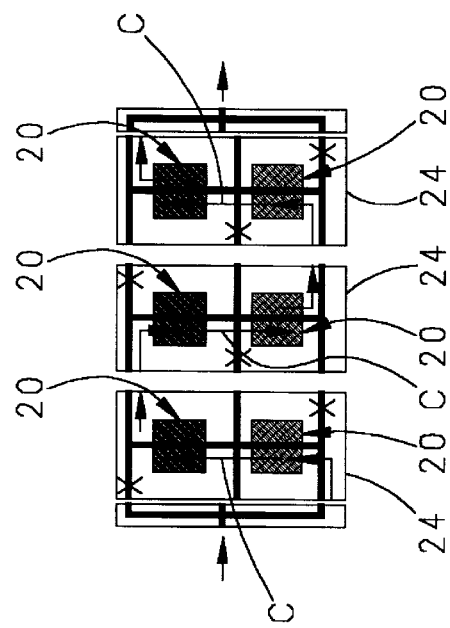
FIGS. 12 through 15 are schematic views of six power electronics devices constructed according to the present invention and shown attached to a coolant manifold.
Figure 14:
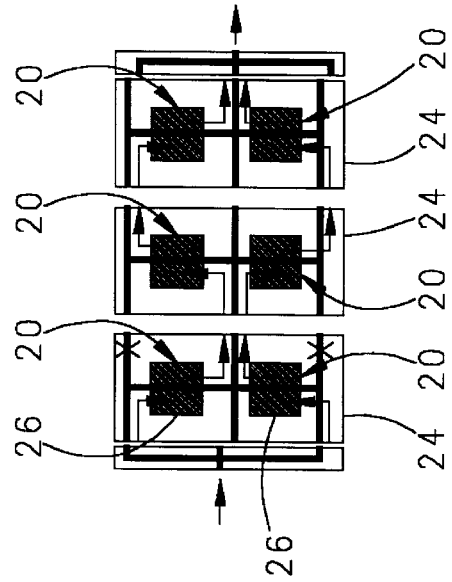
Figure 13:
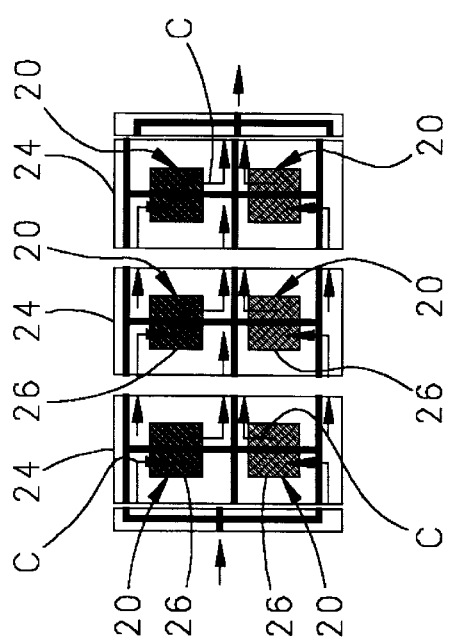
Figure 15:
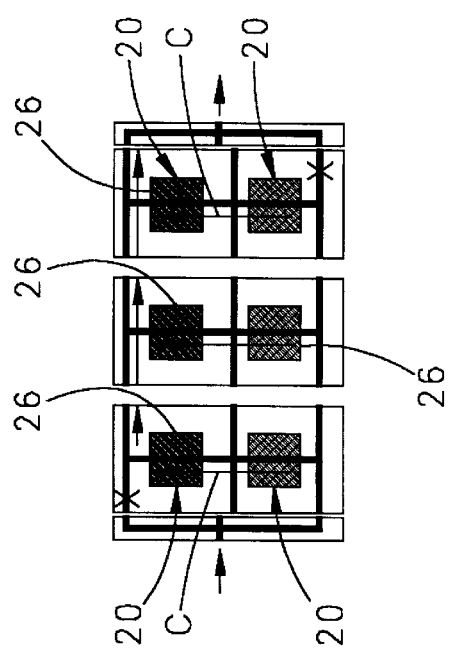

Referring now to the drawings, a modular power electronics device constructed in accordance with the teachings of the present invention is generally referred to by the reference numeral 20. As shown in FIGS. 1 through 6, the power electronics device 20 includes an integrated device cooler 22 and is adapted for use with a coolant manifold 24 having one or more recesses 26 as shown in FIG. 11. The coolant manifold 24 is adapted to receive one or more power electronics devices 20 such that the cooler 22 of each power electronics device 20 is inserted in or otherwise disposed within a corresponding one of the recesses 26. As will be outlined in greater detail below, the manifold 24 is constructed so that a coolant medium (not shown) may be circulated through the manifold and through each recess 26, such that the coolant medium will flow past the cooler 22 disposed therein, thereby permitting the coolant medium to extract heat produced by the power electronics device 20. It will be understood that the coolant medium will flow between an input port 29 and an output port 31 in the recess 26. The coolant will thus circulate through the recess 26 in the direction generally indicated by the reference arrow C in FIGS. 1 and 2.

Preferably, each recess 26 is surrounded by a peripheral seat or ledge 27. The cooler 22 thus hangs freely within the recess 26, which minimizes problems due to different coefficient of thermal expansion (CTE) between the various components. As outlined in greater detail below, the modular design makes it possible for the various components (i.e., the cooler 22, the base 28, etc.) to be relatively small, thus minimizing any problems due to CTE mismatch. A more complete description of one possible coolant manifold may be found in co-pending U.S. patent application Ser. No. 09/220,237, Attorney Docket No. 27578/5175, entitled "Modular Coolant Manifold for Use With Power Electronics Devices Having Integrated Coolers", the entire disclosure of which is incorporated herein by reference, and which is owned by the assignee of the present application.

Figure 9:
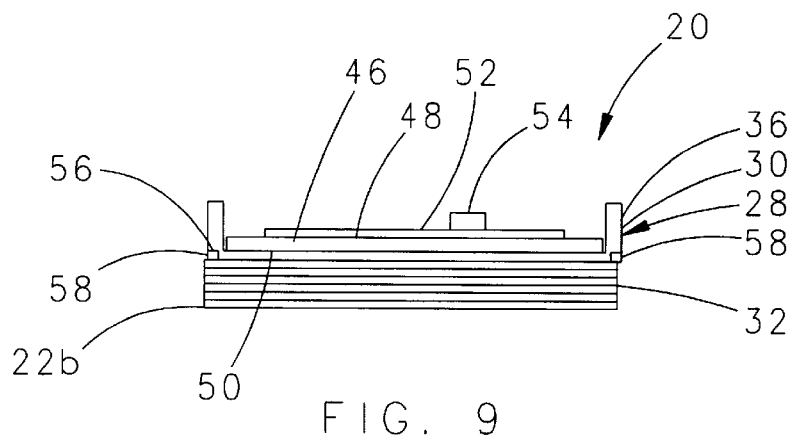
FIG. 9 is an enlarged side elevational view similar to FIGS. 4 and 7 but illustrating a power electronics device having a laminated CHIC device cooler.
Figure 10:
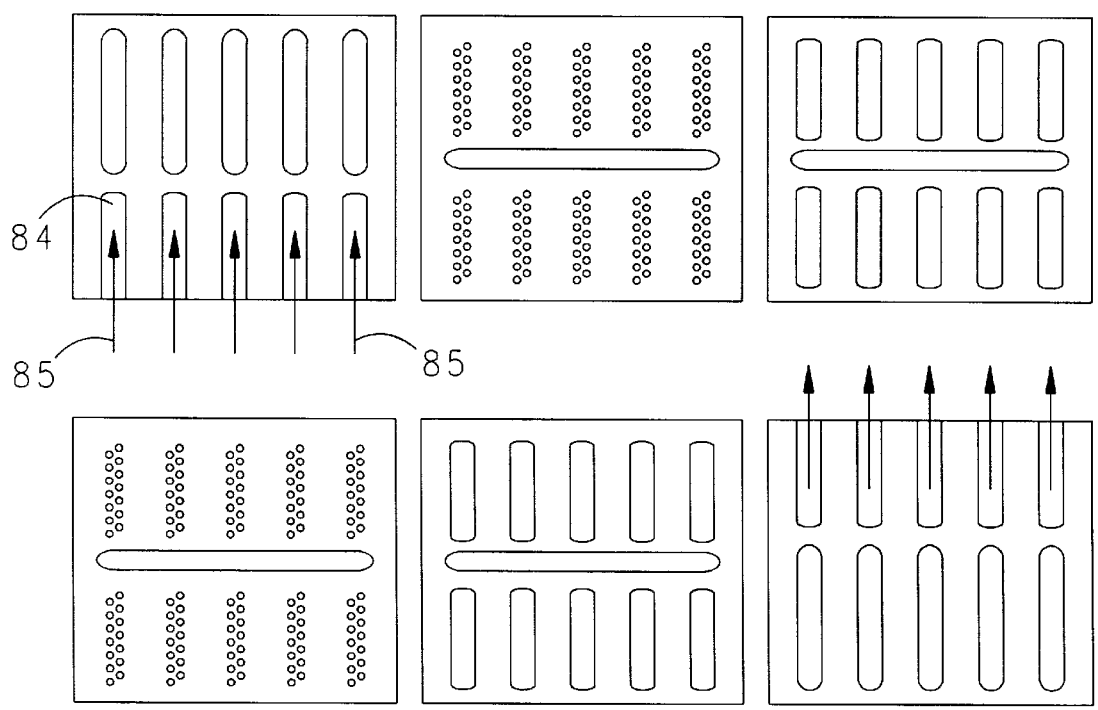
FIG. 10 is an enlarged plan view of six laminations which may be superimpose over each other to form the CHIC device cooler of FIG. 9.

Referring to FIGS. 1 through 6, the power electronics device 20 includes a base 28 having an upper portion 30 and a lower portion 32. The base 28 is preferably formed of a plastic, composite, or a metal matrix composite material, such as Aluminum Silicon Carbide (AlSiC, which is aluminum fused with fibers of silicon carbide). The upper portion 30 includes four peripheral sidewalls 34, 36, 38 and 40. Each sidewall is approximately 0.020 inches thick, although thicker or thinner walls may be formed. The power electronics device 20 also includes a generally planar substrate 42, which is preferably solderable and which is preferably approximately 0.025 inches thick. The sidewalls 34, 36, 38 and 40 surround the substrate 42 so as to form a recess or enclosure 44. The cooler 22 is preferably integrally formed with the base 28, or otherwise bonded, secured or attached to the lower portion 32. It will be noted that in FIGS. 5 and 6 the cooler or cooler 22 is shown in phantom. It is contemplated that the plate fin cooler 22 shown in FIGS. 1 through 3 may be replaced with the zig zag cooler 22a shown in FIGS. 7 and 8, or by the CHIC cooler 22b as shown in FIG. 9 and 10. It will be understood that other cooler or heat sink designs may also be substituted.

Figure 6:
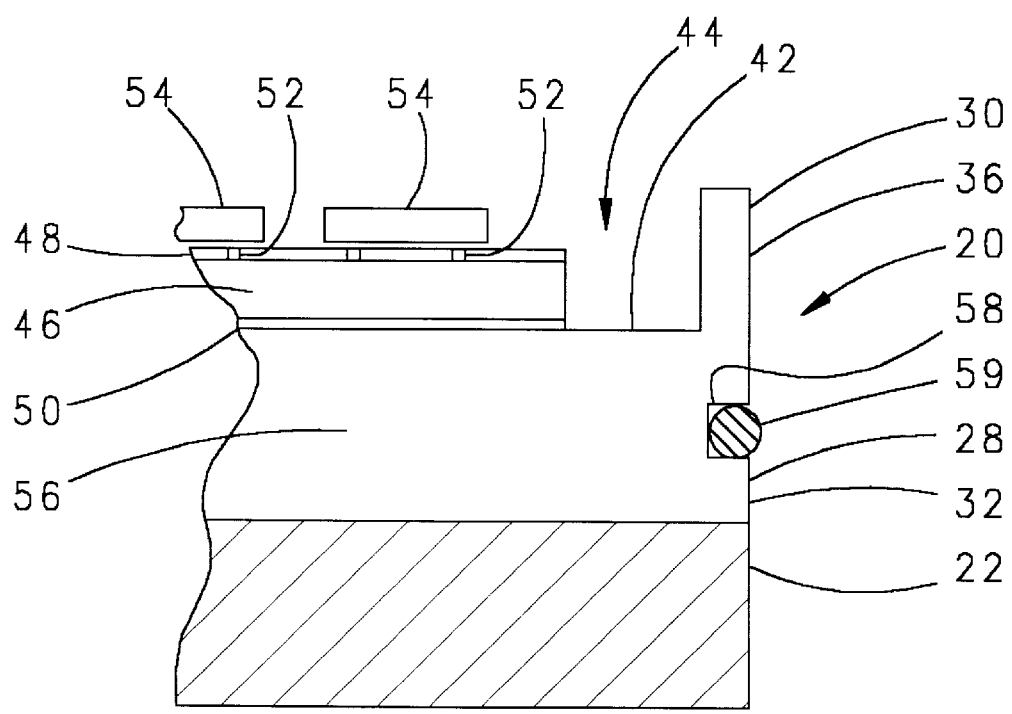
FIG. 6 is a fragmentary cross-sectional view taken along lines 6—6 of FIG. 4.

Referring now to FIG. 6, a ceramic insulator sheet 46 having an upper copper layer 48 and a lower copper layer 50 attached thereto is soldered or bonded to the substrate 42 of the base 28. The insulator sheet 46 is preferably approximately 0.015 inches thick, although other sizes may be used. The copper layers 48, 50 may be attached to the ceramic insulator sheet 46 using known methods as are commonly employed in the art. The upper copper layer 50 is preferably etched using conventional methods to define an electrical circuit 52. One or more electronic components 54 are soldered to the electrical circuit 52 using methods known in the art. The various above-described components may then be connected, such as by wire bonding, hybrid circuit fabrication techniques, or other known techniques. In order to protect the various components, the enclosure 44 is preferably filled with a gel encapsulant, such as Sylguard™ 527. Alternatively, the enclosure may be hermetically sealed as is known in the art.

Figure 1:
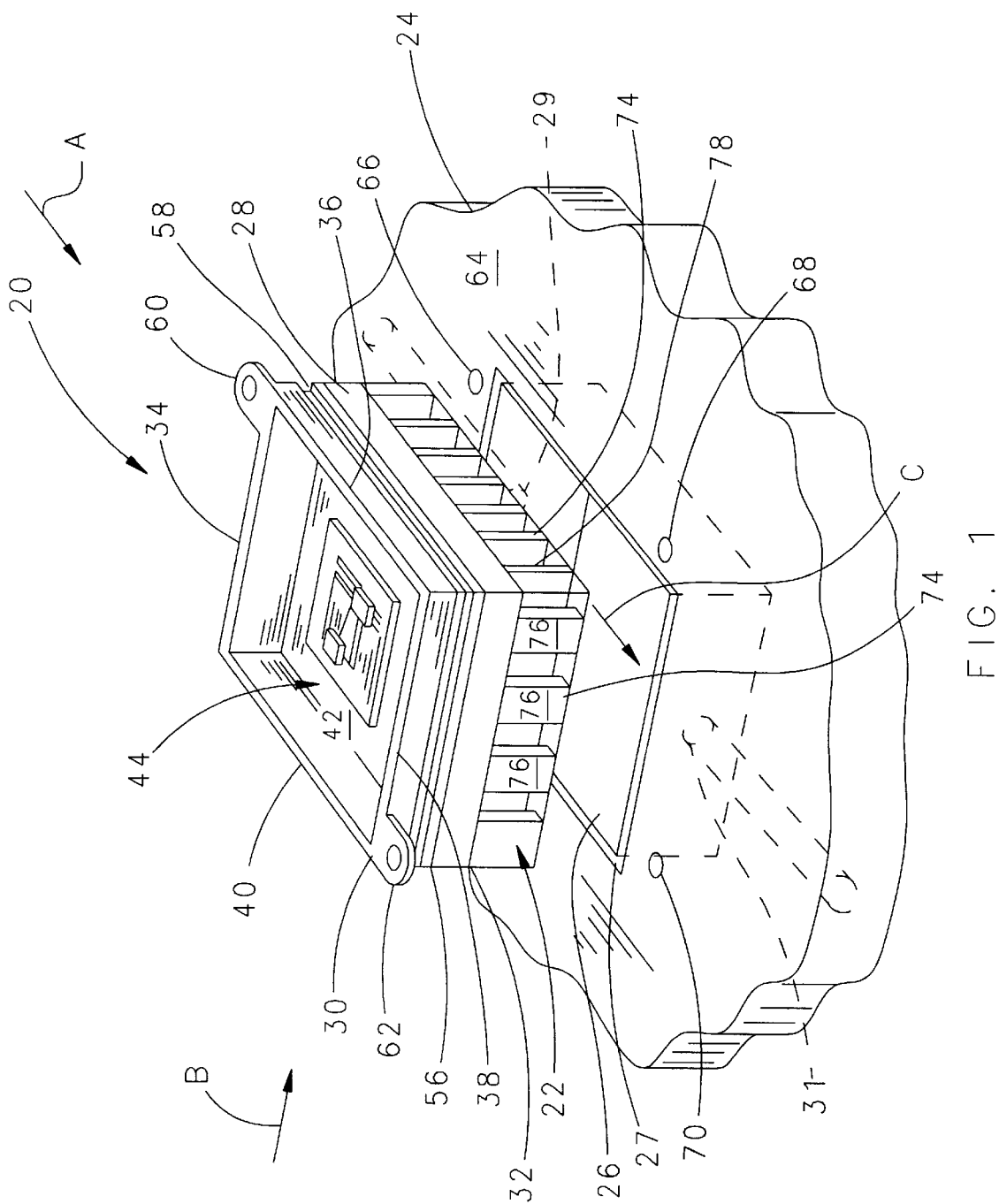
FIG. 1 is a perspective view of a modular power electronics device having an integrated cooler constructed in accordance with the teachings of the present invention; the power electronics device shown incorporates a plate-fin device cooler, although other cooler designs are also contemplated.
Figure 2:
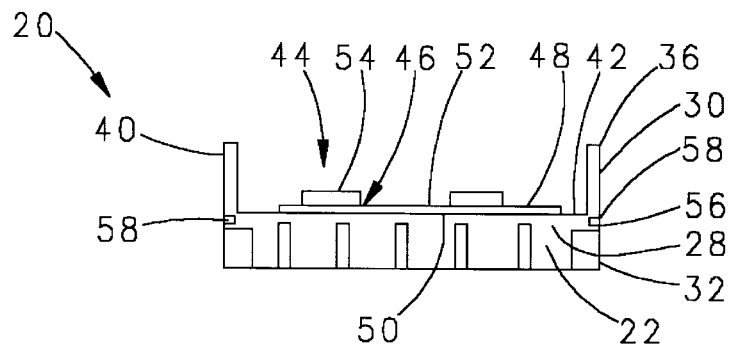
FIG. 2 is an elevational view of the power electronics device shown in FIG. 1

As shown in FIGS. 1, 2 and 6, the base 28 includes central portion 56 which is which fits into the opening defined by the recess 26 on the manifold 24. The central portion 56 preferably includes a peripheral groove 58 which surrounds the central portion 56. An O-ring seal 59 is provided which fits into the peripheral groove 58, thereby preventing the leakage of any coolant medium contained within the manifold 24 from leaking past the base 28. The O-ring seal 59 is preferably a resilient rubber or elastomeric material, and may be formed in a square shape so as to prevent undue stress at the corners defined by the intersecting sidewalls 34, 36, 38 and 40. Alternatively, the corners of the base 28, the peripheral groove 58, and the recess 26 may be rounded.

Figure 3:
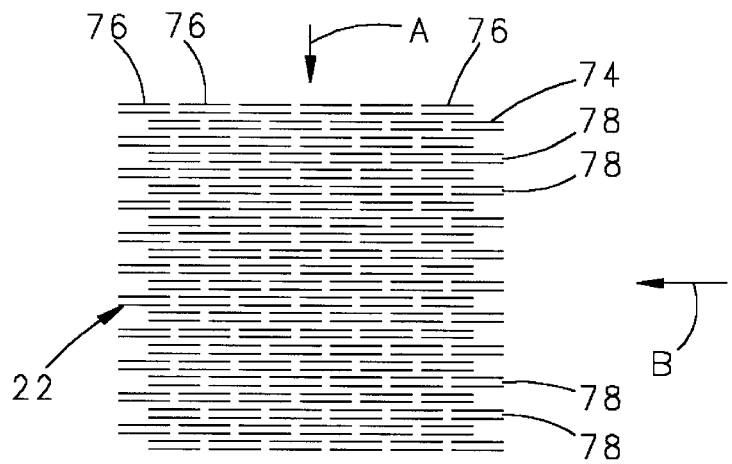
FIG. 3 is a bottom plan view of the power electronics device of FIGS. 1 and 2 and illustrating two possible coolant flow paths through the device cooler.
Figure 4:
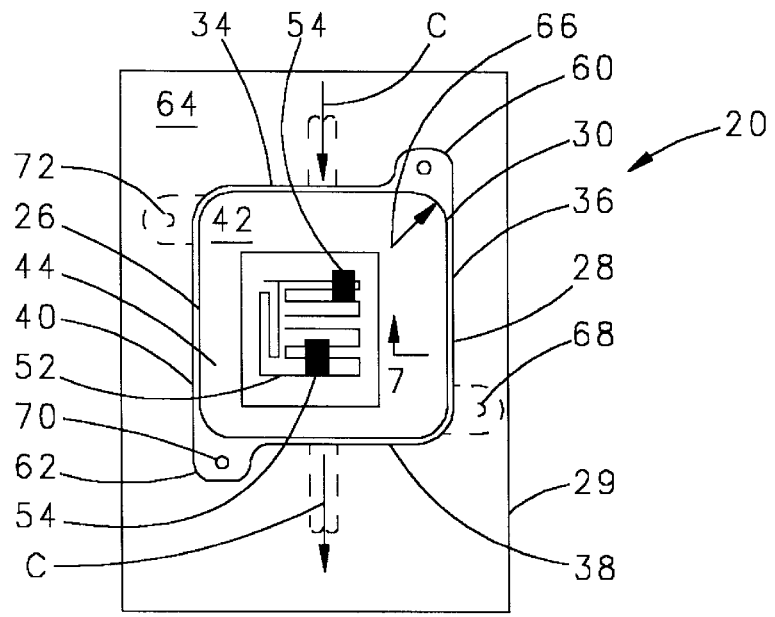
FIG. 4 is a top plan view of the power electronics device shown in FIG. 1.
Figure 5:
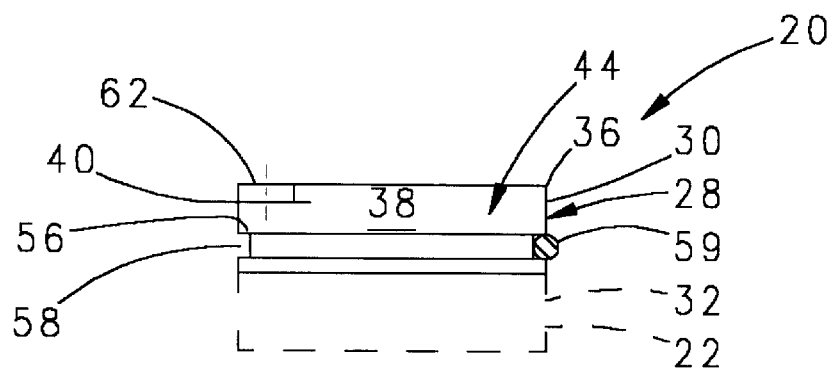
FIG. 5 is a side elevational view taken along lines 5—5 of FIG. 4.

As can be seen in FIGS. 1 through 4, the power electronics device 20 is preferably square. A pair of mounting ears or tabs 60, 62 are disposed on opposite corners of the power electronics device 20. As shown in FIGS. 1 or 4, a top surface 64 of the manifold 24 includes four mounting apertures 66, 68, 70 and 72, which are spaced so that the mounting tabs 60, 62 may be secured to the manifold 24 using two sets of apertures (the mounting aperture 72 in FIG. 1 is obscured by the power electronics device 20). For example, the power electronics device 20 may be secured to the manifold 24 in a first orientation by attaching the tabs 60, 62 to the apertures 66 and 70, respectively. Alternatively, the power electronics device 20 may be secured to the manifold 24 in a second orientation, perpendicular to the first orientation, by attaching the tabs 60, 62 to the apertures 68, 72, respectively. The position of the tabs 60, 62 when the power electronics device 20 is mounted in the second orientation are shown in phantom in FIG. 4.

It will be understood that the power electronics device 20 is attached to the coolant manifold 24, the cooler 22 is inserted in the recess 26, and the corner tabs are secured to the appropriate mounting apertures as described above. Further, the sides are sealed by the O-ring 59 disposed in the peripheral groove 58. Therefore, the cooler 22 can slide up or down relative to the surrounding walls of the recess 26 as the cooler 22 expands or retracts due to temperature changes. Alternatively, the power electronics device 20 can reside on the seat or ledge 27.

As shown in FIGS. 1 through 3, the cooler 22 includes a plurality of fins 74, each having a wide face 76 and a narrow face 78. Although the fins 74 shown have a generally rectangular cross-section with straight edges, it will be understood that the fins may also be tapered. As shown in FIG. 3, the fins 74 are arranged so that two possible flow paths are defined, one of the flow paths being indicated by the reference arrow "A", and the other flow path being indicated by the reference arrow "B". Further, it will be understood that the flow path "A" is characterized by high pressure drop and high heat transfer, while the flow path "B" is characterized by low pressure drop and low heat transfer. It will also be appreciated that the flow path "A" may be characterized as the "hard" way, and the flow path "B" may be characterized as the "easy" way.

Figure 7:
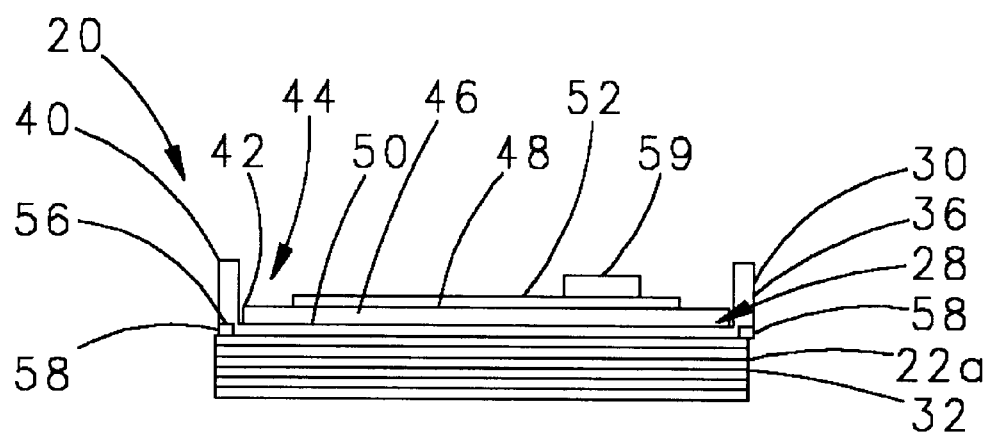
FIG. 7 is an enlarged side elevational view similar to FIG. 2 but illustrating a power electronics device having a laminated zig zag device cooler.
Figure 8:
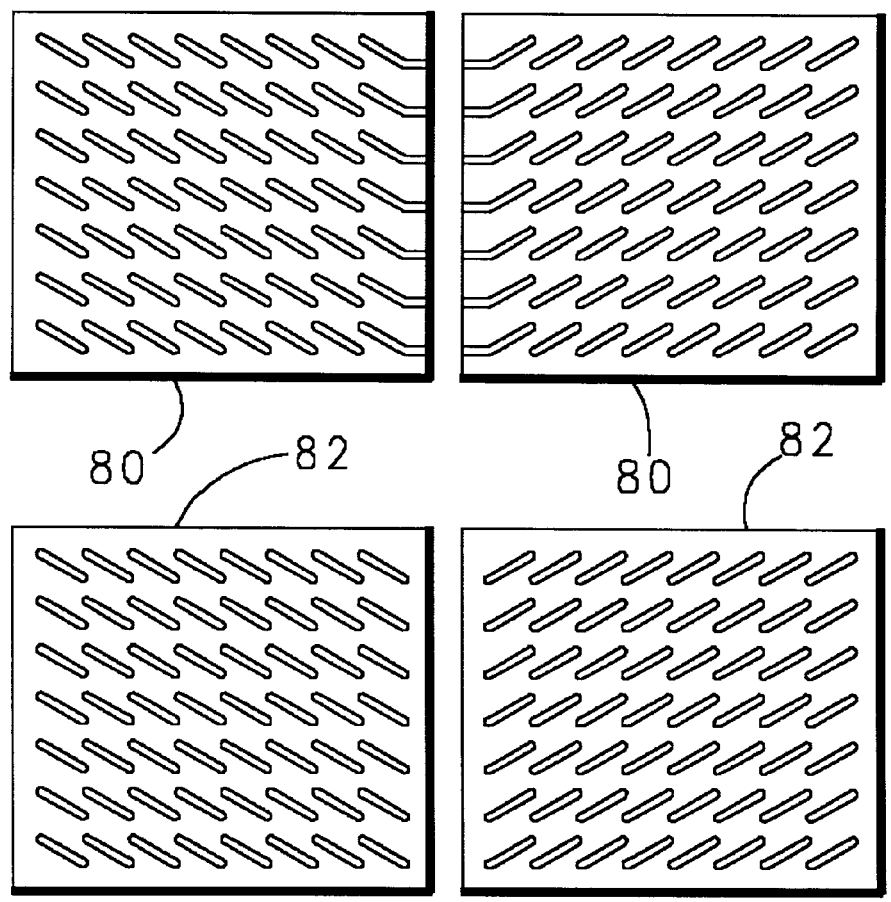
FIG. 8 is an enlarged plan view of four laminations which may be superimposed over each other to form the zig zag device cooler of FIG. 7 and which laminations may be aligned to form two possible flow paths through the device cooler.

Referring now to FIG. 7 and 8, one possible alternate cooler 22a may be comprised of a plurality of first and second laminations 80, 82 which together form a zig zag cooler device. The laminations may be constructed of copper, preferably approximately 0.012 inches thick. A more complete description of a zig zag type cooler apparatus may be found in co-pending U.S. patent application Ser. No. 09/033,926, entitled "Cooling Apparatus and Method of Assembling Same, filed Mar. 3, 1998, the entire disclosure of which is incorporated herein by reference, and which is owned by the assignee of the present application. Each of the laminations includes a plurality of openings 84. The laminations 80, 82 may be placed such that when the laminations 80 and 82 are assembled together in stacked alignment, a plurality of passages 85 are formed. The passages 85 extend between opposing sides of the cooler 22a. The passages 85 have a back-and-forth or zig-zag shape and extend through overlapping openings 84 in the laminations, i.e., a passage 85 extends laterally through an opening 84 in the lamination 80, then extends down to an opening 84 in the adjacent lamination 82, and thence laterally. At the other end of the opening 84 in the lamination 82, the passage extends upwardly again to the opening in the lamination 80. It will be appreciated, as described more fully in the above referenced co-pending application, that the adjacent laminations may be disposed in two possible relative orientations. One of the orientations will be characterized by high pressure drop and high heat transfer as the coolant medium flows through the passages 85, and the other orientation will be characterized by low pressure drop and low heat transfer. Note that with the edge entry/exit into the cooler 22a permitted by the design of the present recess 26, no entry ports or headers need be provided in order to communicate the coolant medium through the present cooler 22a.

In operation, the power electronics device 20 may be formed as follows. The base 28 and the cooler 22 may be formed in a single furnace braze or by using other joining methods such as diffusion bonding. Alternatively, the base 28 and the cooler 22 may be cast as a single unit. Otherwise, in the event one of the illustrated alternate coolers 22a, 22b, or another cooler design (not shown) is used, the cooler may be attached in a separate furnace operation or attached using other known methods. The ceramic insulator sheet 46 having the upper copper layer 48 and the lower copper layer 50 is attached to the substrate 42 of base 28 by soldering, bonding, or other suitable methods. One or more electronic components 54 are soldered to the electrical circuit 52 defined in the upper copper layer 50 using methods known in the art. The various above-described components 54 may then be connected, such as by wire bonding, hybrid circuit fabrication techniques, or other known techniques. After testing, the enclosure 44 is filled with a gel encapsulant, such as Sylguard™. Alternatively, the enclosure may be hermetically sealed.

As shown in FIGS. 1 and 4, the power electronics device 20 is mounted to the manifold 24 such that the cooler 22 resides in or is inserted in the recess 26. The central portion 56 having the peripheral groove 58 fits into recess, such that the O-ring seal 59 forms a leak proof barrier, thereby preventing the leakage of any coolant medium contained within the manifold 24. The power electronics device 20 is secured to the manifold 24 by attaching the tabs 60 and 62 using fasteners connected to the mounting apertures 66, 70, respectively, in order to achieve the orientation illustrated in FIGS. 1 and 4. Alternatively, the power electronics device may be bonded to the manifold 24 in the chosen orientation. The orientation shown corresponds to the flow path "A" (i.e., the coolant flowing in the direction "C" follows the hard way of flow path "A" through the cooler 22).

The power electronics device 20 may be turned ninety degrees to a different orientation, and secured to the manifold 24 by attaching the tabs 60, 62 to the apertures 68, 72, respectively, such as is shown in phantom in FIG. 4. In the alternate orientation, the coolant medium flowing in the direction "C" will circulate past the cooler 22 following the easy way of flow path "B".

It will be appreciated that, in order to achieve the required degree of cooling capacity, a number of power electronics devices 20 assembled according to the present invention may be attached to a manifold 24 having a plurality of recesses 26 such as is shown in each of FIGS. 12 through 15. Each of the Power electronics device's 20 shown therein may be secured to its corresponding recess in either of the two above-described orientations. Further, because of the modular standardized design of each power electronics device 20, the device cooler may any one of the above-described cooler designs.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. The details of the structure may be varied substantially without departing from the spirit of the invention, and the exclusive use of all modifications which come within the scope of the appended claims is reserved.

What is claimed:

1. A modular power electronics die cooler for use with a coolant manifold that circulates a coolant medium past a mounting receptacle, the modular power electronics die cooler comprising:
   a base unit mountable to the manifold, the base unit having an upper and a lower portion, the upper portion including a plurality of sidewalls defining an enclosure, the lower portion including a heat sink, the heat sink being insertable in the manifold receptacle;
   an electronic component mounted within the enclosure;
   wherein the base unit includes a plurality of mounting flanges, the mounting flanges permitting the base unit to be mounted to the manifold in a first orientation and a second orientation, the first and second orientations being generally perpendicular to each other,
   so that upon mounting the base unit to the manifold, the heat sink is positioned in the coolant medium to thereby dissipate heat produced by the electronic component.

2. The electronics die cooler of claim 1, wherein the substrate includes mounting means for mounting the substrate to the manifold, the mounting means permitting the substrate to be mounted to the manifold in a first orientation and a second orientation.

3. The electronics die cooler of claim 1, wherein the heat sink includes a plurality of laminations, the laminations define first and second alternate cooperating coolant flow paths through the heat sink, the first alternate flow path causing the coolant medium to undergo high heat transfer and high pressure drop, the second alternate flow path causing the coolant medium to undergo low heat transfer and low pressure drop.

4. A modular power electronics die cooler for use with a coolant manifold having a circulating coolant medium and an open mounting receptacle, the modular power electronics die cooler comprising:
   a base unit mountable to the manifold adjacent the mounting receptacle, the base unit including a plurality of sidewalls defining an enclosure, a portion of the enclosure defining a substrate, a portion of the base unit defining an integral heat sink insertable in the manifold receptacle; and
   an electronic component mounted to the substrate;
   wherein the base unit includes a plurality of mounting flanges, the mounting flanges permitting the base unit to be mounted to the manifold in a first orientation and a second orientation, the first and second orientations being generally perpendicular to each other,
   so that upon mounting the base unit to the manifold the heat sink is positioned in the coolant medium to thereby dissipate heat produced by the electronic component.

5. A modular power electronics die cooler for use with a coolant manifold having a circulating coolant medium and an open mounting receptacle, the modular power electronics die cooler comprising:
   a base unit mountable to the manifold adjacent the mounting receptacle, the base unit including a plurality of sidewalls defining an enclosure, a portion of the enclosure defining a substrate, a portion of the base unit defining an integral heat sink insertable in the manifold receptacle; and
   an electronic component mounted to the substrate,
   wherein the base unit includes mounting means for mounting the base unit to the manifold wherein the mounting means permits the base unit to be mounted to the manifold in a first orientation and a second orientation,
   so that upon mounting the base unit to the manifold the heat sink is positioned in the coolant medium to thereby dissipate heat produced by the electronic component.

6. A modular power electronics die cooler for use with a coolant manifold having a circulating coolant medium and an open mounting receptacle, the modular power electronics die cooler comprising:
   a base unit mountable to the manifold adjacent the mounting receptacle, the base unit including a plurality of sidewalls defining an enclosure, a portion of the enclosure defining a substrate, a portion of the base unit defining an integral heat sink insertable in the manifold receptacle; and
   an electronic component mounted to the substrate,
   wherein the heat sink includes a plurality of laminations, the laminations define first and second alternate cooperating coolant flow paths through the heat sink, the first alternate flow path causing the coolant medium to undergo high heat transfer and high pressure drop, the second alternate flow path causing the coolant medium to undergo low heat transfer and low pressure drop,
   so that upon mounting the base unit to the manifold the heat sink is positioned in the coolant medium to thereby dissipate heat produced by the electronic component.

7. For use with a manifold having a circulating coolant medium through a passage, a power electronics die cooler having an integrated cooling device, comprising:

a base unit mountable to the manifold, a portion of the base unit defining a substrate, the base unit including an integral heat sink insertable in the manifold passage; and at least one electronic component mounted to the substrate, wherein the base unit includes a plurality of mounting flanges, the mounting flanges permitting the base unit to be mounted to the manifold in a first orientation and a second orientation, the first and second orientations being generally perpendicular to each other, so that upon mounting the base unit to the manifold the heat sink is positioned in the coolant medium to thereby dissipate heat produced by the electronic component.

8. For use with a manifold having a circulating coolant medium through a passage, a power electronics die cooler having an integrated cooling device, comprising:

a base unit mountable to the manifold, a portion of the base unit defining a substrate, the base unit including an integral heat sink insertable in the manifold passage; and at least one electronic component mounted to the substrate;

wherein the substrate includes mounting means for mounting the substrate to the manifold, the mounting means permitting the substrate to be mounted to the manifold in a first orientation and a second orientation, so that upon mounting the base unit to the manifold the heat sink is positioned in the coolant medium to thereby dissipate heat produced by the electronic component.

* * * * *